United States Patent [19]

Sharma et al.

[11] Patent Number: 4,927,505
[45] Date of Patent: May 22, 1990

[54] METALLIZATION SCHEME PROVIDING ADHESION AND BARRIER PROPERTIES

[75] Inventors: Ravinder K. Sharma, Mesa; Harry J. Geyer, Phoenix; Douglas G. Mitchell, Tempe, all of Ariz.

[73] Assignee: Motorola Inc., Schaumburg, Ill.

[21] Appl. No.: 386,058

[22] Filed: Jul. 28, 1989

Related U.S. Application Data

[62] Division of Ser. No. 215,108, Jul. 5, 1988, Pat. No. 4,880,708.

[51] Int. Cl.$^5$ .................. H01L 21/48; H01L 21/28; H01L 21/308; C25D 7/12
[52] U.S. Cl. .................. 204/34.5; 204/38.4; 204/192.25; 204/192.3; 357/71; 428/620; 437/192
[58] Field of Search .............. 357/71; 204/192.25, 204/192.3, 34.5, 38.4; 437/192; 428/620

[56] References Cited

U.S. PATENT DOCUMENTS

| | | | |
|---|---|---|---|
| 4,310,569 | 1/1982 | Harrington | 427/89 |
| 4,486,946 | 12/1984 | Jopke et al. | 437/192 |
| 4,491,860 | 1/1985 | Lim | 357/68 |
| 4,732,865 | 3/1988 | Evans et al. | 437/192 |
| 4,753,851 | 6/1988 | Roberts et al. | 437/246 |
| 4,787,958 | 11/1988 | Lytle | 437/192 |

OTHER PUBLICATIONS

Dening et al., IEEE/IRPS, pp. 30–36, (1984).
Meyer et al., J. Vac. Sci. Technol., A3(3), pp. 772–776, May/Jun. 1985.
Nowicki et al., Thin Solid Films, vol. 53, pp. 195–205, (1978).

Primary Examiner—G. L. Kaplan
Attorney, Agent, or Firm—Joe E. Barbee; Miriam Jackson

[57] ABSTRACT

A titanium-tungsten-nitride/titanium-tungsten/gold (TiWN/TiW/Au) packaging interconnect metallization scheme is used to provide electrical contact to chip level interconnect metallization on a semiconductor substrate. The TiWN/TiW/Au packaging interconnect metallization scheme provides for good adhesion and barrier properties that withstand high temperatures and improve the reliability of the semiconductor chip. The TiWN layer provides good adhesion to the chip level interconnect metallization and the passivation layer. It also provides improved barrier properties to prevent the diffusion of other metal atoms through it. The TiW layer provides good adhesion to the gold metal layer. A gold bump may be electroplated to the gold layer and automatically bonded to a conductive lead of a tape in TAB packaging; or a wire bonded to the gold layer in conventional packaging.

17 Claims, 1 Drawing Sheet

METALLIZATION SCHEME PROVIDING ADHESION AND BARRIER PROPERTIES

This is a division of Ser. No. 07/215,108 filed July 5, 1988 and now Pat. No. 4,880,708.

BACKGROUND OF THE INVENTION

This invention relates, in general, to a metallization scheme providing adhesion and barrier properties, and more particularly, to a packaging interconnect metallization scheme used in semiconductor device manufacture to provide electrical contact to a semiconductor substrate.

Barrier and adhesion metals used in semiconductor device manufacture can be used as part of a packaging interconnect metallization. A chip level interconnect metallization makes electrical contact to the semiconductor chip, while the packaging interconnect metallization provides the electrical contact between the chip level interconnect metallization and a wire or a conductive lead.

Several methods may be used to package a semiconductor die or chip. Standard die attach and wire bonding techniques or Tape Automated Bonding (TAB) are two such methods. In conventional wire bonding a barrier and adhesion metallization scheme may be provided between the chip level interconnect metallization and a conductive metal pad. A wire may then be bonded to the conductive metal and the package. In TAB, a barrier and adhesion metallization scheme is provided between the chip level interconnect metallization and a bump metallization. The bump metallization provides an interface between the semiconductor chip and a conductive lead on the tape. The barrier and adhesion metallization scheme must provide good adhesion to the chip level interconnect metallization, the chip dielectric or passivation layer, and the bump metallization. The metallization must also exhibit good adhesion properties when subjected to high temperatures. After packaging, a semiconductor die may see temperatures of as high as approximately 400° C., therefore, the adhesion of the metallization must be able to withstand these temperatures. It is especially important that the adhesion is reliable in the packaging interconnect metallization because it must be able to pass wire pull or lead pull tests. The barrier and adhesion metallization scheme must also provide a barrier to the diffusion of other metal atoms through it. The diffusion of other metal atoms must by prevented because an unfavorable reaction between some metals may occur, causing corrosion and eventual reliability problems. In addition, the diffusion of some metals to the semiconductor substrate may cause a degradation in the electrical characteristics of the device.

Many different metallization schemes are used to provide barrier and adhesion properties. Titanium-tungsten (TiW) is a well known barrier and adhesion layer. Meyer et al discuss the use of a TiW/Au metallization scheme layer in a paper entitled, "Metallurgy of TiW/Au/Cu System for TAB Assembly," published in J. Vac. Sci. Technol., May/Jun '85, pp. 772-776. In this reference the chip level interconnect metallization is aluminum and the bump metallization is gold. The passivation layers used were heavily doped PSG, silicon nitride, and polyimide The TiW acts as both the adhesion and barrier layers. The conductive leads of the tape are made of copper.

Although Meyer et al discuss that improvements in the barrier properties of TiW can be achieved by sputtering the TiW in the presence of nitrogen to form a titanium-tungsten-nitride (TiWN), no attempt was made to use TiWN. TiWN has been shown to have improved barrier properties over TiW in a paper by Nowicki et al entitled, "Studies of the Ti-W/Au Metallization on Aluminum," published in Thin Solid Films, Vol. 53, 1978, pp. 195-205. The use of a TiW/TiWN/TiW/Au metallization is discussed. The interdiffusion between aluminum and gold with the TiW/TiWN/TiW as the barrier and adhesion metallization scheme is discussed Here the two layers of TiW act as adhesion layers to the aluminum layer and the gold layer. TiWN acts only as a barrier layer. Nowicki et al do not suggest that TiWN may be used as an adhesion layer. The TiWN is sandwiched between the TiW layers because the TiWN has different adhesion properties than TiW. Thus, even though the TiWN has been proven to improve the barrier properties, in the past, TiWN has not been thought to be entirely satisfactory as an adhesion layer in packaging interconnect metallization. Although the use of TiW to sandwich the TiWN is one solution to the adhesion problem, it would be advantageous and more cost effective to provide a packaging interconnect metallization scheme having good adhesion and barrier properties with fewer metallization layers.

Other applications for TiWN have been discussed. In a paper entitled, "Reliability of High Temperature I²L Integrated Circuits," by Dening et al, published in IEEE/IRPS Proc. 1984, International Reliability Physics Symposium, pp. 30-36, the use of TiWN as a barrier layer in chip interconnect metallization is discussed. Here it was found that TiWN did not adhere well to the wafer oxide or the gold layer. Sheldon C. P. Lim discusses the use of TiWN as a fuse link and as a barrier metal in U.S. Pat. No. 4,491,860, issued on Jan. 1, 1985. However there is no suggestion that TiWN can be used as an adhesion layer in a packaging interconnect metallization scheme.

The present invention provides for an improved packaging interconnect metallization scheme using TiWN to provide excellent adhesion properties, as well as barrier properties. that is able to withstand high temperatures.

Accordingly, it is an object of the present invention to provide a packaging interconnect metallization scheme having excellent adhesion properties.

Another object of the present invention is to provide a packaging interconnect metallization scheme having excellent barrier properties.

A further object of the present invention is to provide a packaging interconnect metallization scheme having a high resistance to corrosion and exhibiting excellent adhesion properties after being subjected to high temperatures, thus improving the reliability of a semiconductor device.

Yet another object of the present invention is to provide a packaging interconnect metallization scheme having low contact and sheet resistance.

Yet a further object of the present invention is to provide a packaging interconnect metallization scheme using TiWN as an adhesion layer, thus providing lower processing costs.

SUMMARY OF THE INVENTION

In accordance with the present invention, the above and other objects and advantages are provided by a packaging interconnect metallization scheme having excellent adhesion and barrier properties. Used as a part of a packaging interconnect metallization in TAB packaging, a titanium-tungsten-nitride layer provides improved barrier properties to metal diffusion as well as adhering well to chip level interconnect metallization and a passivation layer on a semiconductor chip. A titanium-tungsten layer provides better adhesion to a subsequent metal layer than titanium-tungsten-nitride. The subsequent metal layer is a conductive metal layer or bump, preferably made of gold, which provides for bonding of the chip to a conductive lead of a tape in TAB packaging. The titanium-tungsten-nitride/titanium-tungsten/gold packaging interconnect metallization scheme provides for increased resistance to corrosion, improved reliability, the ability to withstand high temperatures, and can be fabricated with lower processing costs.

The preferred embodiments of the present invention are illustrated in the accompanying drawings for purposes of exemplification, and are not to be construed as limiting in any manner.

DETAILED DESCRIPTION OF THE DRAWINGS

Figure 1A:
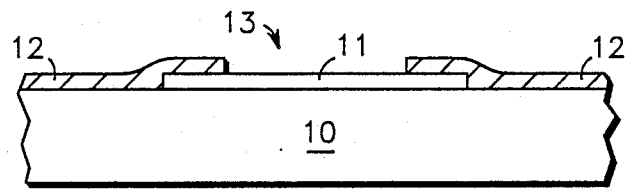
FIGS. 1A-1E illustrate an embodiment of the process flow in accordance with the present invention.

Referring now to FIGS. 1A-1E, a method embodying the present invention is illustrated. FIG. 1A illustrates a small portion of an integrated circuit. Located on a substrate 10, is an aluminum or aluminum alloy bonding pad 11. Hereinafter, the word aluminum will be used to refer to either an aluminum or an aluminum alloy. Aluminum bonding pad 11 is part of the chip level interconnect metallization. In place of the aluminum, a similar metal with good conductive properties may also be used to provide electrical contact to a semiconductor substrate. Also illustrated in FIG. 1A is a patterned passivation layer 12. In a preferred embodiment, passivation layer 12 is made of polyimide. Polyimide layer 12 is patterned using standard photolithography techniques to provide an opening 13, over bonding pad 11. Other passivants, such as a phosphosilicate glass (PSG) or a silicon nitride, can be used as passivation layer 12.

Figure 1B:
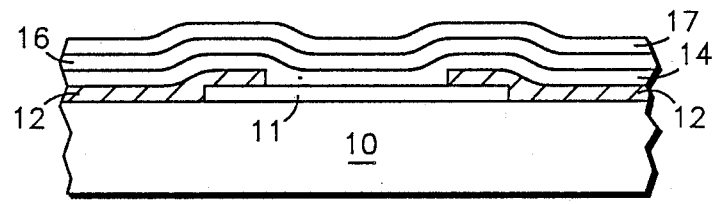

FIG. 1B illustrates the structure of FIG. 1A covered with a metallization scheme. To ensure good adhesion properties the structure may be sputter etched to remove any aluminum oxide that has formed on bonding pad 11. This etch may also help to clean the surface of passivation layer 12 to also ensure good adhesion. TiW is then sputtered in the presence of nitrogen ($N_2$) and argon (Ar) to form a layer of TiWN 14. The amount of nitrogen present will determine how much is incorporated into TiWN layer 14. The $N_2$ and Ar mixture is preferably composed of approximately 30% or greater of nitrogen. Below 30%, TiWN layer 14 will not adhere to passivation layer 12 as well. The thickness of TiWN layer 14 is approximately 1500 to 3000 angstroms. A thickness much below 1500 angstroms will diminish the barrier properties of TiWN. A thickness much above 3000 angstroms can be used but will result in higher processing costs and the TiWN may become brittle. It was found that the TiWN layer 14 exhibited excellent adhesion properties to polyimide passivation layer 12 and aluminum layer 11, even after a temperature anneal at 400° C. Often times a metallization layer will adhere to a certain substrate before being subjected to a temperature anneal, however, after the anneal the metallization may not adhere well. After packaging, semiconductor devices may see temperatures as high as 400° C., therefore, test are made in order to ensure that the metallization is reliable in this environment. In the present invention, TiWN is used as an adhesion layer, as well as a barrier layer. It is not necessary to put TiW down as a first adhesion layer as shown in the past. Processing has been simplified and costs have been reduced by not having an extra layer of TiW.

Next, a TiW layer 16 is sputtered on top of TiWN layer 14 to provide good adhesion properties to a metal layer 17 sputtered on TiW layer 16. No nitrogen is added during the sputtering of TiW layer 16, thus the TiW is of highest available purity. A TiW thickness between approximately 500 and 1000 angstroms is believed to be thick enough to ensure a good adhesion to metal layer 17. Metal layer 17 is a conductive metal, and is made substantially of gold in this embodiment. One of the functions of gold layer 17 is to prevent TiW layer 16 from oxidizing, therefore, it is preferable that gold layer 17 be sputtered immediately following the sputtering of TiW layer 16. If TiW layer 16 oxidizes, gold layer 17 may not adhere well to its surface. The optimum thickness of gold layer 17 is believed to be approximately 4000 angstroms. Gold layer 17 must be thick enough to prevent the diffusion of oxygen through it and to prevent the formation of pinholes which allow plating solution to enter (during the plating of layer 20 shown in FIG. 1D) and corrode TiW layer 16. The lower and upper limits are believed to be approximately 2000 to 7000 angstroms. Another conductive metal, such as copper, that adheres well to TiW is also acceptable.

Figure 1C:
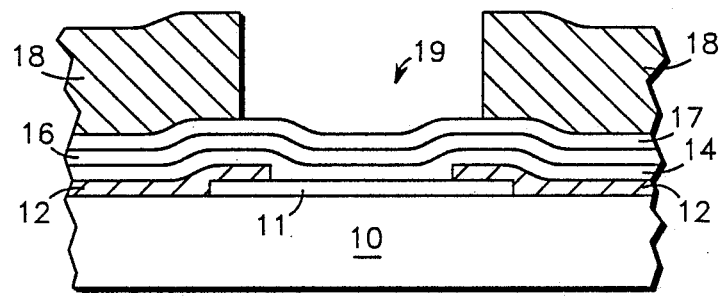

FIG. 1C illustrates the structure of FIG. 1B covered with a patterned photoresist layer 18. An opening 19 is provided by patterned photoresist layer 18. Masking layer 18 may be a positive or negative photoresist, although a positive photoresist is preferred.

Figure 1D:
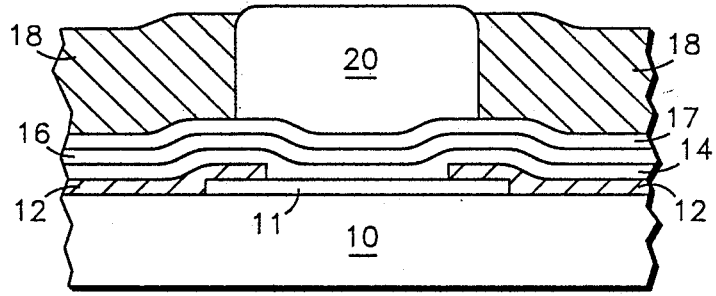

FIG. 1D illustrates the structure of FIG. 1C with a metal layer or bump 20 electroplated onto the surface of gold layer 17 in opening 19 (shown in FIG. 1C) of photoresist layer 18. In a preferred embodiment, bump 20 is made substantially of gold, however, another metal which provides good conductive properties, such as copper. may also be used. In TAB, gold bump 20 provides an interface between a conductive lead of a tape (not shown) and the semiconductor chip. The height of gold bump 20 is approximately 20 to 25 microns. If copper is used as layer 19 or 20, a cleaning step may be required before plating of bump 20 or attachment of a conductive lead to remove the oxide formed on the copper.

Figure 1E:
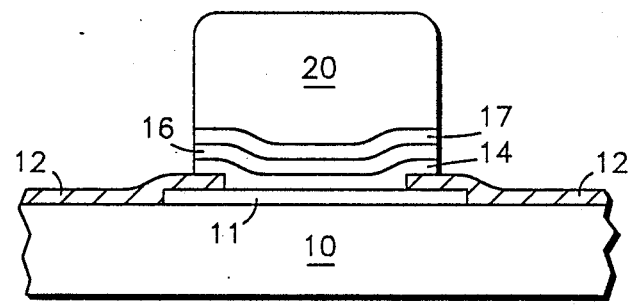

FIG. 1E illustrates the structure of FIG. 1D with the photoresist layer 18 removed. The portions of gold layer 17, TiW layer 16, and TiWN layer 14 not underneath gold bump 20 have also been removed. The metal layers are etched using standard metal etching techniques known by those skilled in the art. Note that the etching steps have been simplified by not having to remove an extra TiW layer as with the TiW/TiWN/TiW/Au metallization scheme. A conductive lead of a tape in TAB (not shown) can now be attached to gold bump 20.

Figure 2:
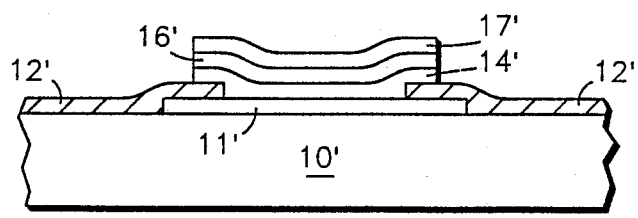
FIG. 2 illustrates another embodiment of the present invention.

FIG. 2 illustrates another embodiment of the present invention. A photoresist layer is patterned on the surface of the structure shown in FIG. 1B such that the layers of metal over the opening in the passivation are protected from removal. A gold layer 17', TiW layer 16', and TiWN layer 14' not removed provide a location where a wire (not shown) can be bonded to gold layer 17' using conventional wire bonding techniques. In another TAB application, a plated bump on a conductive lead (not shown) may be bonded to gold layer 17'.

By now it should be appreciated that there has been provided a new packaging interconnect metallization scheme with excellent adhesion and barrier properties which can reliably withstand high temperatures.

We claim:

1. A method of fabricating a structure for providing adhesion and barrier properties to a semiconductor substrate having a surface, comprising the steps of:
    providing a first conductor layer made of a conductive metal on at least a portion of the surface of the substrate;
    forming a passivation layer on the surface of the substrate and the first conductor layer, and having at least one opening to the first conductor layer;
    forming a second conductor layer made of titanium-tungsten-nitride on the first conductor layer and the passivation layer;
    forming a third conductor layer made of titanium-tungsten on the second conductor layer, and;
    forming a fourth conductor layer made of a conductive metal on the third conductor layer.

2. The method of claim 1 wherein the passivation layer comprises a polyimide.

3. The method of claim 1 wherein the passivation layer comprises a glass.

4. The method of claim 1 wherein the passivation layer comprises silicon nitride.

5. The method of claim 1 wherein the first conductor layer is an aluminum or an aluminum alloy.

6. The method of claim 1 further comprising sputter etching before the step of sputtering the second conductor layer.

7. The method of claim 1 wherein the second conductor layer is formed by sputtering titanium-tungsten with a gas mixture comprised of at least 30% nitrogen.

8. The method of claim 1 wherein the thickness of the second conductor layer is approximately 1500 to 3000 angstroms, the thickness of the third conductor layer is approximately 500 to 1000 angstroms, and the thickness of the fourth conductor layer is approximately 2000 to 7000 angstroms.

9. The method of claim 1 further comprising the steps of removing portions of the fourth conductor layer, the third conductor layer, and the second conductor layer.

10. The method of claim 1 further comprising the steps of:
    forming a fifth conductor layer made of a conductive metal on a portion of the fourth conductor layer over the opening in the passivation layer, and;
    removing portions of the fourth conductor layer, the third conductor layer, and the second conductor layer not underneath the fifth conductor layer.

11. The method of claim 10 wherein the fourth conductor layer and the fifth conductor layer are made substantially of gold.

12. The method of claim 1 wherein the step of forming the third conductor comprises forming the third conductor by sputtering titanium-tungsten substantially without nitrogen present.

13. A method of fabricating a structure for providing electrical contact to a semiconductor substrate having a surface, comprising the steps of:
    providing a conductive metal layer on at least a portion of the surface of the semiconductor substrate;
    forming a passivation layer on the metal layer and the surface of the semiconductor substrate, with at least one opening in the passivation layer to the metal layer;
    sputtering a titanium-tungsten-nitride layer on the metal layer and a portion of the passivation layer;
    sputtering a titanium-tungsten layer on the titanium-tungsten-nitride layer; and
    providing a first gold layer on the titanium-tungsten layer.

14. The method of claim 13 further comprising sputter etching the substrate before the sputtering of titanium-tungsten-nitride.

15. The method of claim 13 wherein the layer of titanium-tungsten nitride is formed by sputtering titanium-tungsten with a gas mixture comprised of at least 30% nitrogen.

16. The method of claim 13 further comprising:
    electroplating a second gold layer on a portion of the first gold layer; and
    removing portions of the first gold layer, the titanium-tungsten layer, and the titanium-tungsten-nitride layer not underneath the second gold layer.

17. The method of claim 13 wherein the step of sputtering a titanium-tungsten layer comprises sputtering without significant nitrogen present.

* * * * *